United States Patent
Zheng et al.

(10) Patent No.: US 7,040,005 B2
(45) Date of Patent: May 9, 2006

(54) PROCESS OF MAKING A GMR IMPROVEMENT IN CPP SPIN VALVE HEAD BY INSERTING A CURRENT CHANNELING LAYER (CCL)

(75) Inventors: Youfeng Zheng, San Jose, CA (US); Kochan Ju, Monte Sereno, CA (US); Otto Voegeli, Morgan Hill, CA (US)

(73) Assignee: Headway Technologies, Inc., Milpitas, CA (US)

( * ) Notice: Subject to any disclaimer, the term of this patent is extended or adjusted under 35 U.S.C. 154(b) by 264 days.

(21) Appl. No.: 10/392,118

(22) Filed: Mar. 19, 2003

(65) Prior Publication Data

US 2004/0184197 A1    Sep. 23, 2004

(51) Int. Cl.
G11B 5/187 (2006.01)
G11B 5/33 (2006.01)

(52) U.S. Cl. .............................. 29/603.07; 29/603.13; 29/603.14; 360/324.1; 360/324.11

(58) Field of Classification Search ............. 29/603.07, 29/603.08, 603.13, 603.14; 360/324, 324.1, 360/324.11, 324.12, 324.2
See application file for complete search history.

(56) References Cited

U.S. PATENT DOCUMENTS

| | | | |
|---|---|---|---|
| 5,731,937 A | 3/1998 | Yuan | 360/322 |
| 5,739,987 A | 4/1998 | Yuan et al. | 360/327.32 |
| 5,883,763 A | 3/1999 | Yuan et al. | 360/324 |
| 6,353,318 B1 | 3/2002 | Sin et al. | 324/252 |
| 6,411,478 B1 | 6/2002 | Mao et al. | 360/324.2 |
| 6,466,419 B1* | 10/2002 | Mao | 360/324.12 |
| 6,775,111 B1* | 8/2004 | Lin et al. | 360/324.11 |

FOREIGN PATENT DOCUMENTS

JP    11-213348    * 8/1999

* cited by examiner

Primary Examiner—A. Dexter Tugbang
(74) Attorney, Agent, or Firm—George D. Saile; Stephen B. Ackerman

(57) ABSTRACT

A method of fabricating a current-perpendicular-to-plane (CPP) giant magnetoresistive (GMR) sensor stack, wherein the parasitic resistance of the high-resistance antiferromagnetic (AFM) pinning layer is effectively reduced by enlarging its surface area and forming between it and the remainder of the sensor stack an equal area, contiguous, thin, highly conductive ferromagnetic layer, the current channeling (CCL) layer. The magnetic properties and increased current carrying capacity of the CCL allows the AFM pinning layer to effectively couple to the pinned layer while eliminating the effect of its high resistance on the sensor sensitivity as measured by the GMR ratio, $\Delta R/R$.

6 Claims, 3 Drawing Sheets

*FIG. 1a – Prior Art*

PROCESS OF MAKING A GMR IMPROVEMENT IN CPP SPIN VALVE HEAD BY INSERTING A CURRENT CHANNELING LAYER (CCL)

RELATED PATENT APPLICATION

This application is related to, Ser. No. 10/718,373, filing date Nov. 20, 2003 and to Ser. No. 10/392,118, filing date Mar. 19, 2003, all assigned to the same assignee as the current invention.

BACKGROUND OF THE INVENTION

1. Field of the Invention

This invention relates generally to the fabrication of giant magnetoresistive (GMR) magnetic field sensors of a "current-perpendicular-to-the-plane" (CPP) configuration and more particularly to such a sensor that includes a novel current channeling layer (CCL) that effectively lowers the high parasitic resistance of an antiferromagnetic pinning layer.

2. Description of the Related Art

Magnetic read sensors that utilize the giant magnetoresistive (GMR) effect for their operation are generally of the "current-in-the-plane" (CIP) configuration, wherein current is fed into the structure by leads that are laterally disposed to either side of an active sensor region and the current moves through the structure essentially within the planes of its magnetic and other conducting layers. Since the operation of GMR sensors depends on the detection of resistance variations in their active magnetic layers caused by changes in the relative directions of their magnetic moments, it is important that a substantial portion of the current passes through those layers so that their resistance variations can have a maximally detectable effect. Thus, one problem associated with the CIP formation is that the signal it produces becomes scaled down together with the reduction in its trackwidth. Since this is not a problem with the CPP configuration, the CPP configuration holds the promise of being effective in reading magnetically recorded media having recording densities exceeding 100 Gbit/in$^2$. In addition, the CPP configuration has the benefit of a very low resistance, which also makes it more suitable for very small sensor sizes.

The CPP configuration is not without its problems, however. A significant problem inherent in the CPP configuration is the large voltage drop across magnetically inactive high resistance layers, which tends to mask the voltage variations produced by the active layers. The GMR resistance ratio, $\Delta R/R$, is typically on the very low order of 1% for the CPP design, because the $\Delta R$ is provided by variations of the low resistance, magnetically active layers, whereas R includes the high resistance of inactive layers. It is worth noting that the high value of R also increases Joule heating in the sensor and, therefore, limits the allowable magnitude of the sensing current.

GMR stack designs favor the use of magnetically pinned layers that are pinned by antiferromagnetic (AFM) pinning layers. Antiferromagnetic materials used in such pinning layers tend to be formed of high-resistance materials and it is these layers that provide a parasitic resistance, $R_{pa}$, that is included in R and lowers the sensitivity, $\Delta R/R$, of the CPP sensor.

One approach to alleviating this problem is to discover and use low-resistance AFM materials. This would necessitate a difficult materials search. An alternative approach is to lower the effective parasitic resistance of the AFM layer by changing the sensor geometry and adding a novel current channeling layer. That is the approach taken by the present invention.

Prior art has offered no similar method for improving the sensitivity of the CPP design. Yuan et al. (U.S. Pat. No. 5,883,763) disclose a CPP sensor wherein a GMR layer is positioned between upper and lower permanent magnet biasing layers and the whole structure is then positioned between an upper and lower shield. Conducting layers are formed on the upper and lower surfaces of the biasing layers to separate them from the shields and the GMR layer. Although this approach offers the benefits of improved magnetic biasing, it does not deal with the problem of parasitic resistance.

Yuan et al. (U.S. Pat. No. 5,731,937) discloses a CPP sensor configuration having sensing element dimensions in a particular ratio to current lead dimensions so that the efficiency of the element is thereby increased.

Yuan et al. (U.S. Pat. No. 5,739,987) discloses a GMR transducer assembly operating in a CPP mode and being magnetically biased by a multilayer biasing structure comprising alternating layers of ferromagnetic and antiferromagnetic material.

Mao et al. (U.S. Pat. No. 6,411,478) discloses a spin tunnel junction formed between a bottom shield and a shared pole and separated from each of them by dielectric gaps wherein the spin tunnel junction comprises a magnetically free layer separated symmetrically from two longitudinally disposed pinned layers by edge junctions. Conducting leads contacting the two pinned layers on opposite lateral edges of the configuration feed current through the spin tunnel junction is a CPP configuration.

Sin et al. (U.S. Pat. No. 6,353,318) provides a method for forming a CPP sensor having hard bias layers positioned so as not to allow shorting between the current carrying leads.

The prior art described above does not address the problem of the parasitic resistance of an AFM pinning layer and its adverse affect on sensor sensitivity. In particular, the prior art does not discuss or disclose a method of forming a CPP GMR sensor in which the AFM pinning layer is configured in a novel way and separated from the remainder of the sensor stack by a current channeling layer.

SUMMARY OF THE INVENTION

Accordingly, it is a first object of this invention is to provide a novel current-perpendicular-to-plane (CPP) giant magnetoresistive (GMR) read-sensor stack structure having improved sensitivity.

It is a second object of the present invention to provide a method of fabricating such a novel CPP structure.

It is a third object of the present invention to provide such a CPP GMR read-sensor stack wherein the pinning layer remains advantageously a layer of antiferromagnetic material.

The aforesaid objects will be achieved within three preferred embodiments of the present invention by altering the configuration of a CPP pillar-type sensor, which is a CPP sensor in which the GMR sensor stack, (pinned layer/spacer layer/free layer), is formed on an antiferromagnetic pinning layer and the combination (AFM layer/GMR stack) is positioned between upper and lower lead/shield layers of substantially larger surface area than the equal surface areas of the stack layers. In a first preferred embodiment, the alteration provided by the present invention consists of enlarging the dimensions of the antiferromagnetic pinning layer to make it substantially equal in area to the shield/lead layer on which it is formed and inserting a contiguous, highly conductive, layer having good ferromagnetic coupling properties, the current channeling layer (CCL), which is of equal area to the pinning layer, between the pinning layer and the GMR sensor stack. The new formation is thereby: AFM pinning layer/CCL /GMR stack, with the AFM layer and the CCL being of equal area to the shield/lead layer. Within this configuration, the AFM layer still effectively pins the pinned layer through the ferromagnetic properties of the CCL, but its parasitic resistance is effectively lowered as a result of the increased current area provided by the CCL so that the sensitivity of the sensor, as measured by ΔR/R, is substantially increased.

In two other preferred embodiments, the GMR sensor is a synthetic configuration in which the pinned layer is an antiferromagnetically coupled layer comprising two ferromagnetic layers with antiparallel magnetizations. In one of these additional embodiments, the second preferred embodiment, the synthetic structure is formed on a wider AFM layer which is covered by a CCL, in a manner substantially similar to the first preferred embodiment. In a third preferred embodiment, the CCL layer is omitted and the synthetic pinned layer is formed with a greater width and, thereby, functions as a CCL.

BRIEF DESCRIPTION OF THE DRAWINGS

FIG. 1a is a schematic cross-sectional view through the air-bearing surface (ABS) of a prior art pillar-type CPP GMR sensor configuration.

DESCRIPTION OF THE PREFERRED EMBODIMENTS

Figure 1B:
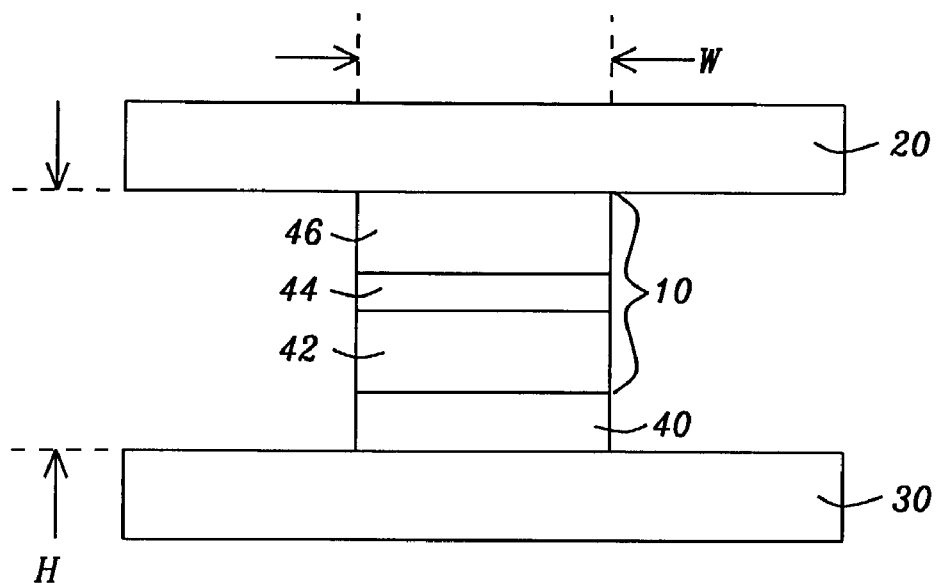
FIG. 1b is a similar schematic cross-sectional view through the ABS of the configuration of a first preferred embodiment of the present invention.
Figure 1B:
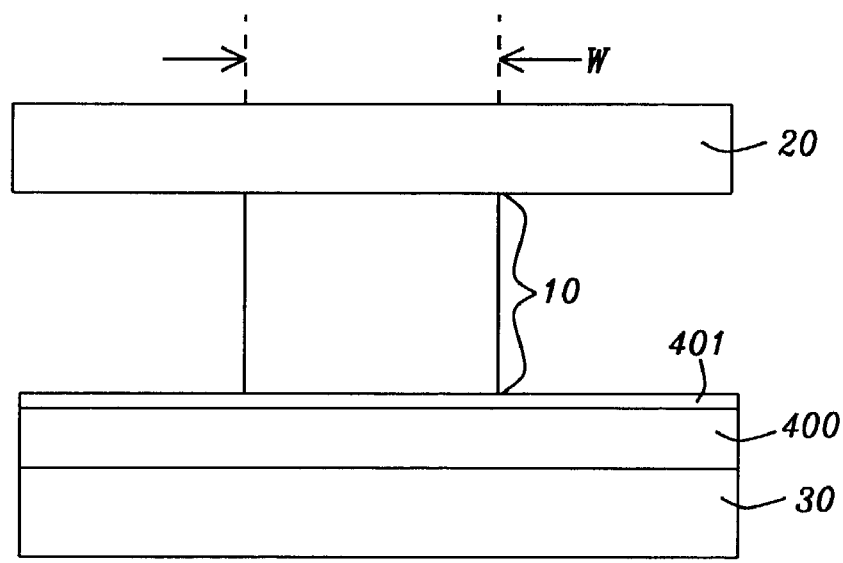

The first preferred embodiment of the present invention is a CPP GMR read head comprising a GMR sensor stack formed between an upper and lower shield/lead layer wherein the parasitic resistance of the high-resistance AFM pinning layer is minimized to reduce its effect in lowering the sensor sensitivity, ΔR/R. It differs from the prior art pillar-type read head shown schematically in FIG. 1a in that the pillar-type configuration provides a sensor stack in which all layers are of equal horizontal cross-sectional surface area, whereas in the first preferred embodiment of the present invention, the area of the AFM pinning layer is substantially increased and a CCL of equal area is formed between it and the stack.

Referring first to FIG. 1a there is shown a schematic cross-sectional view through the ABS plane of a pillar-type CPP GMR read head of the prior art. The GMR stack (10), of thickness $t_{GMR}$, and physical track width W, is formed on an antiferromagnetic (AFM) layer (40) of thickness $t_{AFM}$ and equal width W, the two together being positioned between an upper (20) and lower (30) shield/ lead layer, which layers provide both magnetic shielding of the sensitive GMR stack and also serve to both inject and extract a sensing current which is the basis for the operation of the stack. As is well known in the art, the stack (10) comprises a succession of layers including a pinned layer (42), a non-magnetic, conducting spacer layer (44) formed on the pinned layer and a ferromagnetic free layer (46) formed on the spacer layer. The upper shield/lead layer (20) is formed on the free layer. The smaller surface areas of the stack layers relative to the shield/lead layers give the stack plus AFM layer configuration the general appearance of a pillar, hence its name. As indicated in the figure, the equal AFM layer width and stack width is denoted W and the height of the GMR stack and the AFM layer is denoted H.

Ignoring the lead resistance and the contact resistance, the total resistance, $R_{pillar}$, of the stack plus AFM layer is equal to:

$$R_{pillar} = (\rho_{GMR})(t_{GMR})(WH)^{-1} + (\rho_{AFM})(t_{AFM})(WH)^{-1}$$

and:

$$\Delta R_{pillar} = (\Delta\rho_{GMR})(t_{GMR})(WH)^{-1},$$

where $\rho_{GMR}$ is the resistivity of the GMR stack, $\rho_{AFM}$ is the resistivity of the AFM layer and WH is the product of the width and height of the pillar. Changes in the resistivity of the GMR stack produced by its magnetic activity (shifting of free and pinned layer magnetizations from parallel to antiparallel) are denoted $\Delta\rho_{GMR}$ and they are solely responsible for resistance changes, $\Delta R_{pillar}$, of the entire formation because the AFM layer does not undergo a resistivity change during magnetic activity. Since the resistance of the AFM layer is typically between 5 and 10 times the resistance of the GMR layer, the reduction of the ratio ΔR/R is significant.

Referring next to FIG. 1b, there is shown the new formation of a first preferred embodiment of the present invention in which the horizontal surface area of the AFM layer (400) is enlarged to make it completely contiguous and congruent with (having equal surface area and dimensions of the surface with which it is in contact) the shield/lead layer (30). A CCL (401) of equal surface area is then formed contiguously and congruently on the AFM layer. Note that "surface area" as used herein refers to the area of the contact surface (in the horizontal plane) between successively formed layers. In the figure, which is a schematic cross-sectional view through the ABS surface of the formation, there is seen the upper shield/lead layer (20) and the lower shield/lead layer (30). The enlarged AFM layer (400) is formed on the lower shield/lead layer (30) and is contiguous with it and has substantially the same surface area. The enlarged AFM layer has an increased effective current flow width, (W+Δ), and a thickness $t_{AFM}$. In the preferred embodiment, the AFM layer can be a layer of antiferromagnetic material such as IrMn, FeMn, PtMn or NiMn and can be formed to a thickness between approximately 50 and 200 angstroms. The thin, ferromagnetic, conducting layer (401), the current channeling layer (CCL), is formed on the AFM layer and is contiguous and congruent with it. It is very important that the CCL layer be highly conductive and, at the least, that it not adversely affect the magnetic coupling between the pinned and pinning layers. This can be achieved by the use of highly conductive ferromagnetic material with good ferromagnetic coupling. The CCL satisfying these conditions is preferably a layer of Ni, Fe or Co and is formed to a thickness between approximately 10 and 50 angstroms. The use of Ni is preferred because, together with its high conductivity, it has good ferromagnetic coupling and low magnetic moment. The GMR stack (10) is formed centrally disposed on the CCL. The layers in the stack are the same as those shown in FIG. 1a, also denoted as (10). The final width of the layers in the GMR stack are all equal to W, which is the physical track width of the sensor and is less than 0.1 microns for high density applications. This width is different from that of the AFM and CCL layers, the differences being a result of width reduction by patterning only the GMR stack layers after the initial deposition of all the layers. It is to be noted that all layers are initially formed with substantially the same dimensions, but the patterning reduces the width of the GMR stack is reduced to W, which was the width of both the stack and AFM layer in the prior art of FIG. 1a.

As a result of the increased width and area of the AFM layer and the contiguous and congruent formation of the CCL directly upon it, the current is spread out through the increased volume of the AFM layer and the effective (parasitic) resistance of the AFM layer is substantially reduced. Calculations have compared the current density distribution in the AFM layer in three AFM configurations: 1) the pillar design of FIG. 1a; 2) a half-pillar design in which the AFM layer is enlarged, but there is no CCL layer; and 3) the design of the present invention as shown in FIG. 1b. In case 1, the current distribution is defined by the dimension of the pillar (eg. the product WH). In case 2, the current distribution is basically the same as case 1, with little current beyond the region in which the AFM layer contacts the GMR stack, since the resistivity of the AFM layer is so great. In case 3, the current is distributed throughout the AFM layer as a result of the CCL layer formed on it.

In the CCL configuration of FIG. 1b, the resistance of the GMR stack plus the AFM layer, $R_{CCL}$, is given by:

$$R_{CCL} = (\rho_{GMR})(t_{GMR})(WH)^{-1} + (\rho_{AFM})(t_{AFM})((W+\Delta)(H+\Delta))^{-1}$$

and:

$$\Delta R_{CCL} = (\Delta \rho_{GMR})(t_{GMR})(WH)^{-1} + (\rho_{AFM})(t_{AFM})((W+\Delta+\delta)(H+\Delta+\delta))^{-1} - (\rho_{AFM})(t_{AFM})((W+\Delta)(H+\Delta))^{-1}$$

In the expressions, $(W+\Delta+\delta)$, $(H+\Delta+\delta)$, $(W+\Delta)$ and $(H+\Delta)$, $\Delta$ signifies the extra distance traveled by the current due both to the increased width of the AFM layer and the increased height added by the insertion of the CCL layer. The term $\delta$ represents the current path difference in the AFM layer between the high resistance anti-parallel state and the low resistance parallel state. $\delta$ can be positive or negative, depending upon the relative resistivity between the GMR stack and the AFM layer. This is an ohmic effect rather than a magnetic effect. It is obvious that $R_{CCL}$ is smaller than $R_{pillar}$ because of the $\Delta$ in the AFM layer.

The CCL design of the present invention can not only reduce the R value in $\Delta R/R$, but it can, under some circumstances, increase the $\Delta R$ value. Either will improve the ratio and, therefore, improve the sensor sensitivity. It is found that when the product, $(\rho_{AFM})(t_{AFM})$ is greater than $(\rho_{GMR})(t_{GMR})$, the value of $\delta$ is negative. As a result, the expression $((W+\Delta+\delta)(H+\Delta+\delta))^{-1} - ((W+\Delta)(H+\Delta))^{-1}$ is positive, increasing $\Delta R$ for the CCL case as compared to $\Delta R$ for the pillar case. The table below lists the values of R, $\Delta R$ and $\Delta R/R$ for pillar, half pillar and CCL designs in a CPP structure of 0.1 μm track width, having the following materials and physical parameters: an AFM layer of thickness approximately 150 angstroms, having:

$\rho_{AFM}$=200 μΩcm;

a GMR stack of approximately 150 angstroms in thickness having:

$\rho_{GMR}$=20 μΩcm;

and a CCL layer of Ni of thickness approximately 10 angstroms.

| Configuration | R (Ω) | ΔR (mΩ) | ΔR/R |
|---|---|---|---|
| Pillar | 2.96 | 26.3 | 0.89 |
| Half-Pillar | 2.76 | 27.3 | 0.99 |
| CCL | 2.32 | 30.4 | 1.31 |

It is seen that with the insertion of a 10 angstrom thick CCL, the improvement in $\Delta R/R$ is 47%. It is also worth noting that the effect of the CCL increases with a decrease in track width, making the configuration particularly useful in a read head designed for high recorded density applications. It must also be noted that the CCL material can be a ferromagnetic material which is a good conductor, such as Ni, Fe or Co, whose presence will not adversely affect the antiferromagnetic coupling between the AFM layer and the pinned layer. Ni, having good magnetic coupling properties and low magnetic moment, is a particularly good candidate and is the preferred choice.

In the second and third preferred embodiments of the present invention, the method of the present invention will be applied to fabricate a CPP synthetic spin valve structure, wherein the pinned layer is an antiferromagnetically coupled laminated structure of the following form: AP2/coupling layer/AP1. In this laminated structure AP2 and AP1 are ferromagnetic layers whose magnetic moments are antiparallel (AP) and the coupling layer can be a layer of suitable non-magnetic, electrically conducting material such as Ru and wherein the AP2 layer is closest to the AFM pinning layer.

Figure 2A:
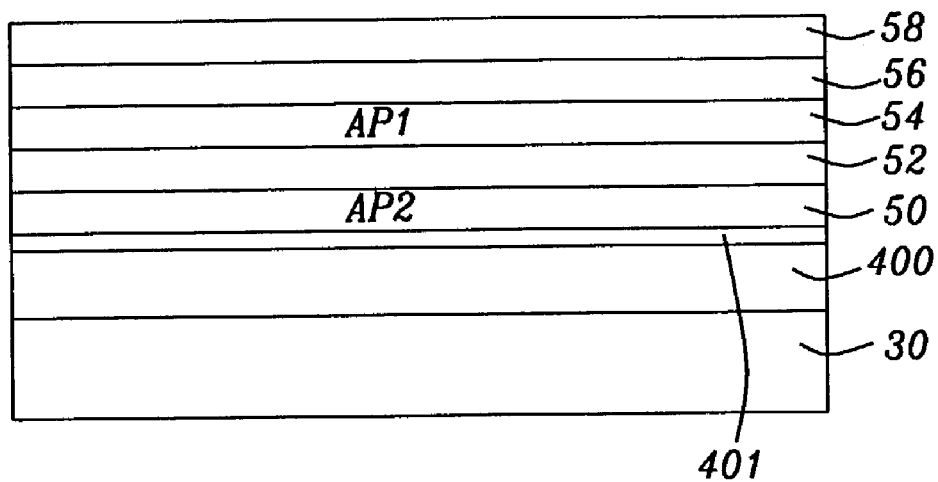
FIGS. 2a–b show two steps in the formation of a second preferred embodiment of the present invention wherein the GMR stack includes a synthetic antiferromagnetically coupled pinned layer and a primary CCL layer.

Referring now to FIG. 2a, there is shown a schematic cross-sectional ABS view of an as-deposited CPP synthetic spin valve stack, prior to GMR stack patterning. For the formation of a second preferred embodiment, to be fully described by reference to FIG. 2b, this stack includes a primary CCL layer (401). For a third preferred embodiment, also to be described below, the patterning of the stack will, in and of itself, create an effective CCL layer, so the primary CCL layer (401) may be omitted. A stack that does not contain a primary CCL layer and which is, therefore suitable for the third preferred embodiment, will be described in FIG. 3a and the patterning of the stack will be described in FIG. 3b.

Returning to the stack of FIG. 2a, which will form the second preferred embodiment of the present invention, there is seen a lower shield/lead layer (30) upon which is formed a contiguous AFM pinning layer (400) of substantially equal surface area to the shield layer, the AFM layer being preferably formed of an antiferromagnetic material such as MnPt and formed to a thickness between approximately 80 and 150 angstroms. A CCL (401) is formed on the AFM pinning layer, the CCL being a layer of ferromagnetic, conducting material such as Ni, Fe or Co which has good magnetic coupling properties, formed to a thickness between approximately 10 and 50 angstroms. Of these three materials, Ni is preferred for its lower magnetic moment. A synthetic antiferromagnetically coupled pinned layer is formed on the CCL, the synthetic layer comprising a ferromagnetic layer denoted AP2 (50), on which is formed a conductive, non-magnetic coupling layer (52), on which is formed a ferromagnetic layer denoted AP1 (54). The two ferromagnetic layers will be antiferromagnetically coupled by the coupling layer in an antiparallel (AP) magnetic moment configuration (hence the AP1 and AP2 terminology) and pinned therein by the AFM layer. The AP2 ferromagnetic layer (50) is preferably a layer of ferromagnetic material such as CoFe formed to a thickness of between approximately 15 and 50 angstroms; the AP1 ferromagnetic layer is preferably a layer of ferromagnetic material such as CoFe formed to a thickness of between approximately 15 and 50 angstroms and the antiferromagnetically coupling layer (52) is preferably a layer of Ru, formed to a thickness between approximately 7 and 10 angstroms. A conducting, non-magnetic spacer layer (56) is then formed on the synthetic pinned layer, the spacer layer being preferably a layer of Cu formed to a thickness between approximately 20 and 50 angstroms. A ferromagnetic free layer (58) is then formed on the spacer layer, the free layer being preferably a bilayer of ferromagnetic material such as CoFe/NiFe formed to a thickness of between approximately 30 and 60 angstroms.

Figure 2B:
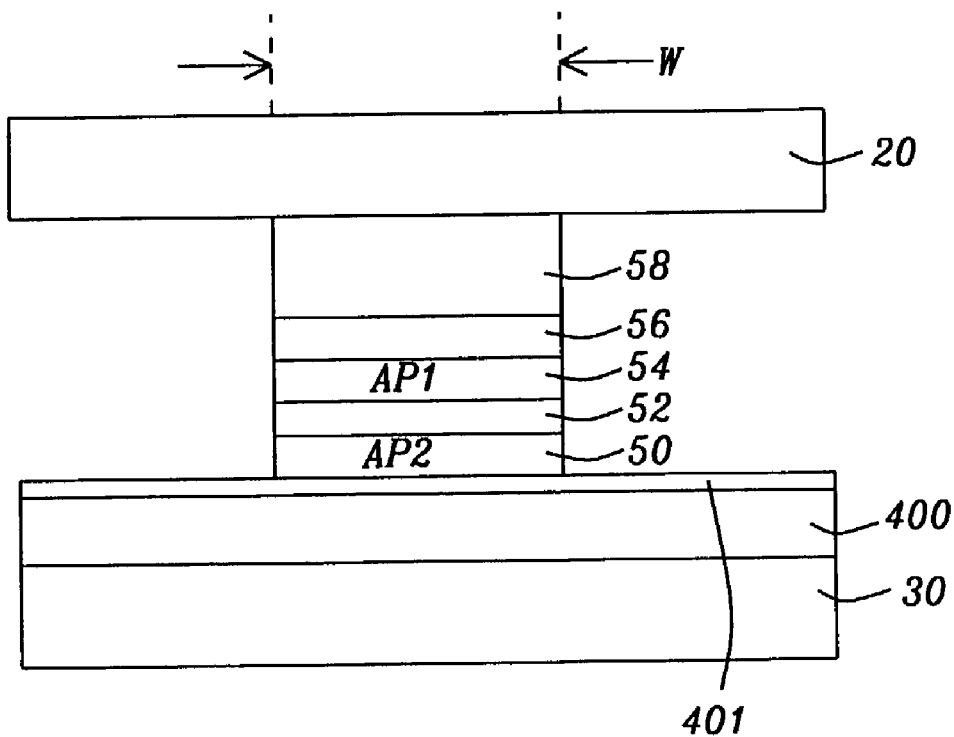

Referring next to FIG. 2*b*, there is shown the fabrication of FIG. 2*a* subsequent to a patterning of a portion of the GMR spin valve stack, in which the portion patterned is centrally disposed and reduced in width to the desired track width of the sensor. This centrally disposed, patterned portion of the sensor will serve as the magnetically active region of the sensor. As is seen schematically in the figure, the patterning includes reducing the width of the free layer (58), the spacer layer (56), the ferromagnetic layer AP1 (54) of the synthetic pinned layer, the antiferromagnetically coupling layer (52) and the ferromagnetic layer AP2 (50). Patterning stops at the bottom of AP2. The CCL (401) and the AFM pinning layer (400) are not patterned and retain substantially their original widths which is also substantially the width of the lower shield/lead layer (30). An upper shield layer (20) is then formed on the ferromagnetic free layer to complete the fabrication.

Figure 3A:
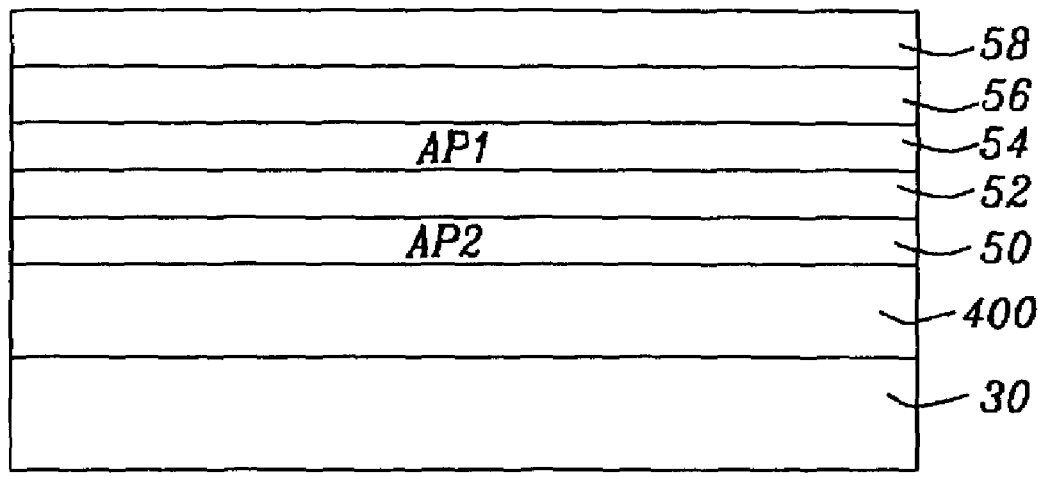
FIGS. 3a–b show two steps in the formation of a third preferred embodiment of the present invention wherein the GMR stack includes a synthetic antiferromagnetically coupled pinned layer, omits the primary CCL layer and forms an effective CCL layer by patterning.

Referring next to FIG. 3*a*, there is shown a stack formation identical to that of FIG. 2*a*, except that the primary CCL layer has been omitted. All other layers are exactly as described in FIG. 2*a* and are numbered identically. The patterning of this stack will produce the third preferred embodiment of the present invention.

Figure 3B:
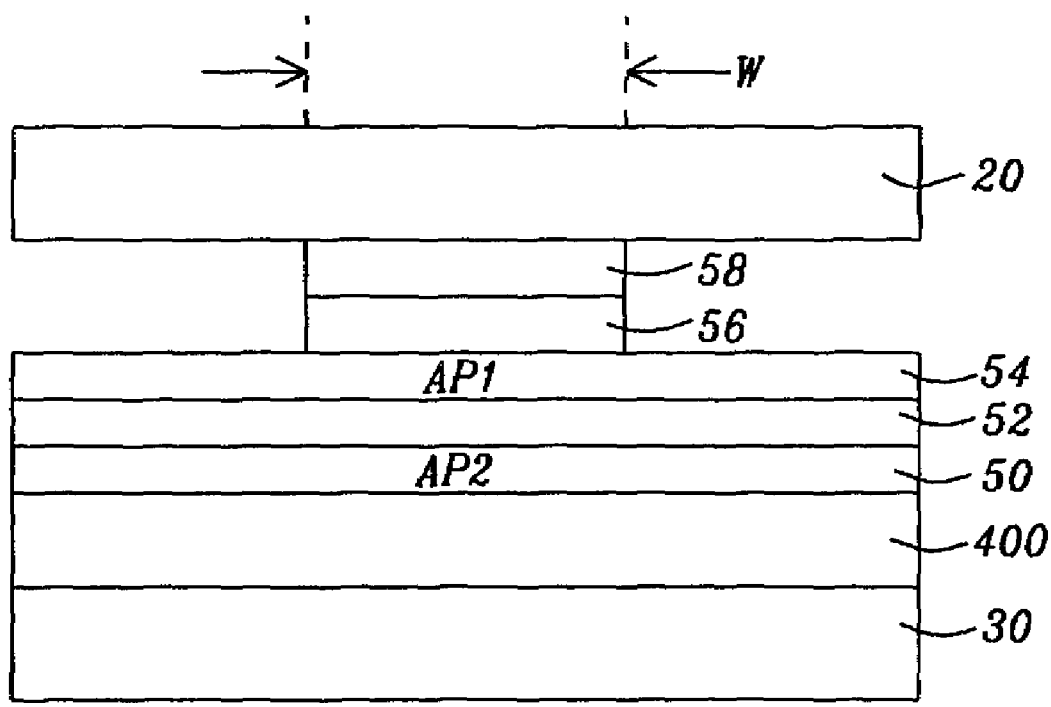

Referring next to FIG. 3*b*, there is shown the fabrication of FIG. 3*a* subsequent to a patterning of a portion of the GMR spin valve stack, in which the portion patterned is centrally disposed and reduced in width to the desired track width, W, of the sensor and will serve as the magnetically active region of the sensor. As is seen schematically in the figure, the patterning includes reducing only the width of the free layer (58) and the spacer layer (56) while keeping them centrally disposed on the AP1 layer (54). The ferromagnetic layer AP1 (54) of the synthetic pinned layer, the antiferromagnetically coupling layer (52) and the ferromagnetic layer AP2 (50) are not reduced in width and remain unpatterned. Patterning stops at the bottom of the spacer layer (56). In this embodiment, the AP1 (54), the coupling layer (52) and the AP2 (50), act together as an effective CCL. A primary CCL is not necessary. An upper shield layer (20) is then formed on the ferromagnetic free layer to complete the fabrication.

As is understood by a person skilled in the art, the preferred embodiments of the present invention are illustrative of the present invention rather than limiting of the present invention. Revisions and modifications may be made to methods, materials, structures and dimensions employed in fabricating CPP sensor stacks having a primary or an effective CCL layer formed as described herein, while still providing a method for fabricating CPP sensor stacks having a primary or an effective CCL layer formed as described herein, in accord with the spirit and scope of the present invention as defined by the appended claims.

What is claimed is:

1. A method for forming a current-perpendicular-to-plane (CPP) GMR sensor of improved sensitivity comprising:

providing a substrate, said substrate being a lower magnetic shield and first current lead layer having a first width and first surface area;

forming an antiferromagnetic (AFM) pinning layer on said substrate, said pinning layer being contiguous and congruent with said substrate;

forming a current channeling layer (CCL) on said AFM layer, said CCL being contiguous and congruent with said AFM layer and said CCL being formed of a highly conductive ferromagnetic material;

forming a patterned GMR stack centrally disposed on said CCL, said GMR stack being patterned to have a second width, W, which is less than said first width and a second surface area which is less than said first surface area and said patterned GMR stack being magnetically coupled to said AFM layer;

forming an upper magnetic shield and second current lead layer on said GMR stack, said second current lead layer having said first width and said first surface area; and wherein said second width, W, is the sensor track width.

2. The method of claim 1 wherein the CCL layer of highly electrically conductive ferromagnetic material will not adversely affect magnetic coupling between said AFM layer and said GMR stack.

3. The method of claim 1 wherein the CCL is a layer of Ni, formed to a thickness between approximately 10 and 50 angstroms.

4. The method of claim 1 wherein the CCL is a layer of Fe or Co formed to a thickness between approximately 10 and 50 angstroms.

5. The method of claim 1 wherein forming said GMR stack further comprises:

forming a pinned ferromagnetic layer on said CCL layer;
forming a non-magnetic spacer layer on said pinned layer;
forming a ferromagnetic free layer on said spacer layer; and
wherein the width of said layers is equal to W, the track width of the sensor.

6. The method of claim 5 wherein said pinned ferromagnetic layer is antiferromagnetically pinned by said AFM layer across said CCL layer.

* * * * *